US006798301B1

(12) United States Patent
Balan et al.

(10) Patent No.: US 6,798,301 B1
(45) Date of Patent: Sep. 28, 2004

(54) METHOD AND APPARATUS FOR CONTROLLING OSCILLATION AMPLITUDE AND OSCILLATION FREQUENCY OF CRYSTAL OSCILLATOR

(75) Inventors: Vishnu Balan, San Jose, CA (US); Tzu-Wang Pan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/879,824

(22) Filed: Jun. 11, 2001

(51) Int. Cl.[7] .............................. H03B 1/00; H03B 5/32
(52) U.S. Cl. ............ 331/74; 331/116 FE; 331/117 FE; 331/109; 331/158; 331/183
(58) Field of Search .......................... 331/74, 116 FE, 331/109, 158, 182, 183, 117 FE

(56) References Cited

U.S. PATENT DOCUMENTS

| 5,030,926 A | * | 7/1991 | Walden ................ 331/116 FE |
| 5,349,309 A | * | 9/1994 | Fujii ......................... 331/175 |
| 6,278,338 B1 | * | 8/2001 | Jansson ...................... 331/109 |
| 6,559,730 B1 | * | 5/2003 | Marvin et al. .............. 331/158 |

OTHER PUBLICATIONS

Huang et al., "Design Considerations for High–Frequency Crystal Oscillators Digitally Trimmable to Sup–ppm Accuracy", Dec. 1997, IEEE Transactions on Very Large Scale Integration (VLSI) Systems, vol. 5, No. 4, pp 408–416.

* cited by examiner

Primary Examiner—Robert Pascal
Assistant Examiner—Kimberly Glenn
(74) Attorney, Agent, or Firm—Thelen Reid & Priest LLP

(57) ABSTRACT

A circuit controls an oscillation amplitude of a crystal oscillator including a crystal resonator, a current source supplying a bias current, and an output transistor coupled to the crystal resonator and the current source. The circuit includes a peak detector for detecting a peak voltage of an output signal of the crystal oscillator, and a controller coupled to the peak detector and to the current source for controlling the current source in accordance with a difference between the peak voltage and a target voltage, the target voltage being set to be substantially equal to $2V_{th}$, where $V_{th}$ is a threshold voltage of the output transistor. A frequency control circuit controls a first switched-capacitor array and a second switched-capacitor array coupled to the crystal resonator, and alternately switches a unit capacitor in the first switched-capacitor array and a unit capacitor in the second switched-capacitor array based on a frequency control signal.

33 Claims, 4 Drawing Sheets

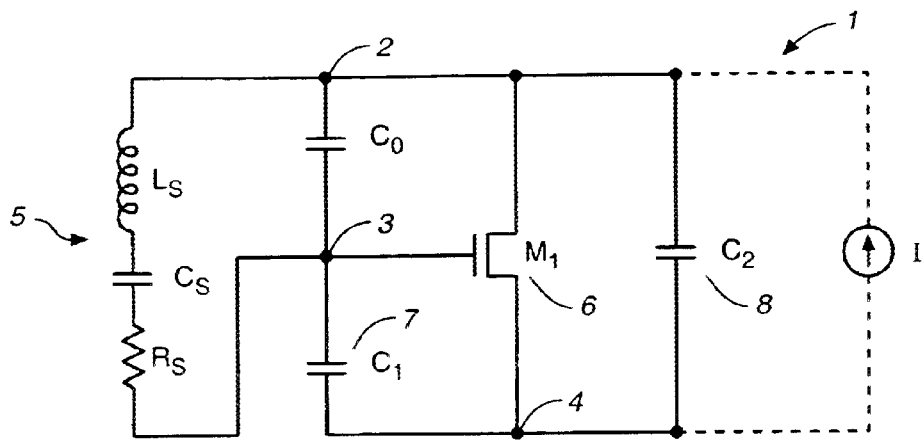
FIG._1A (PRIOR ART)
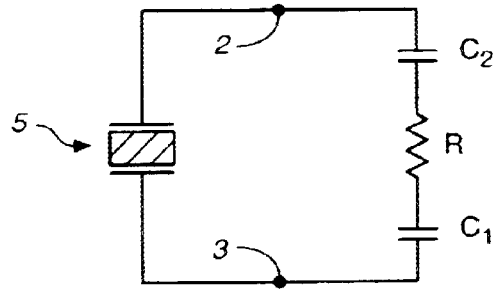
FIG._1B (PRIOR ART)
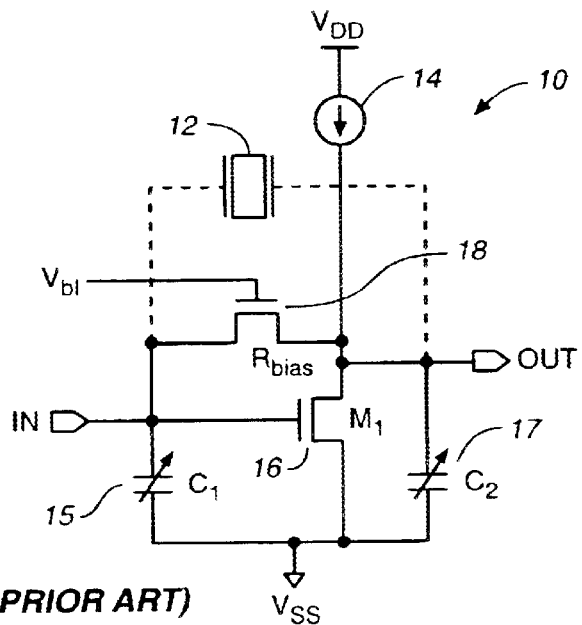
FIG._2 (PRIOR ART)

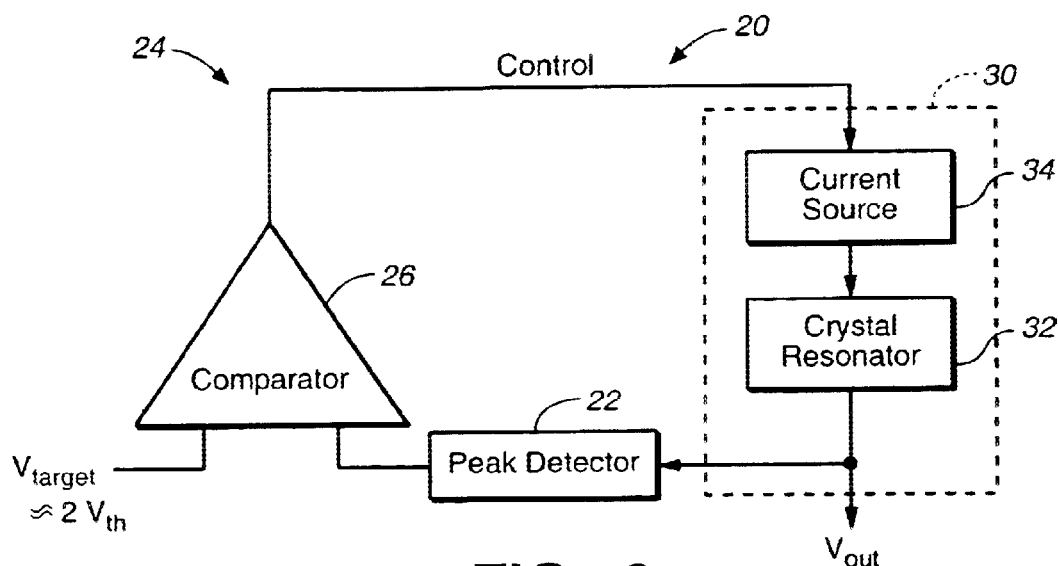
FIG._3
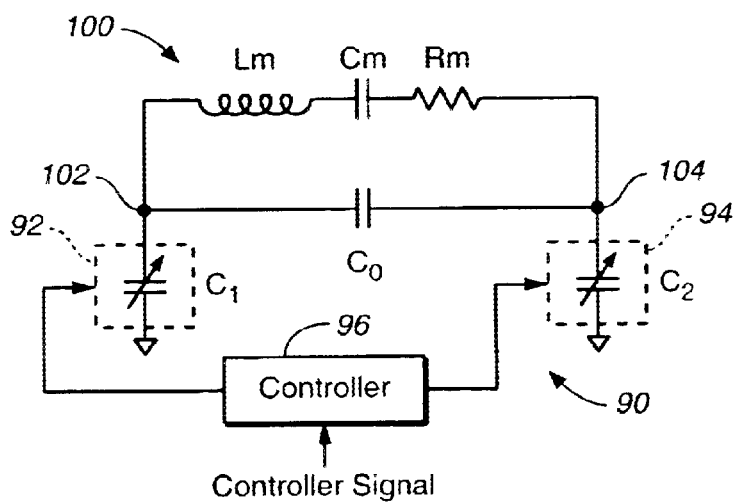
FIG._5
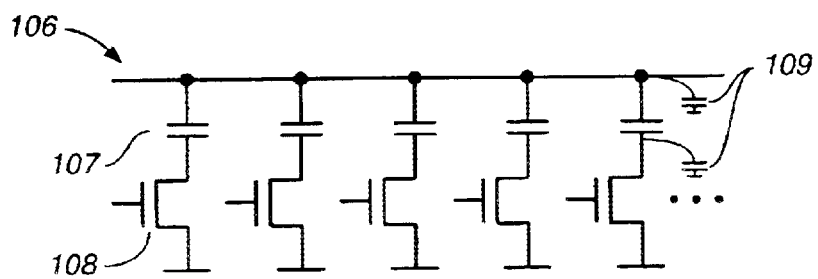
FIG._6

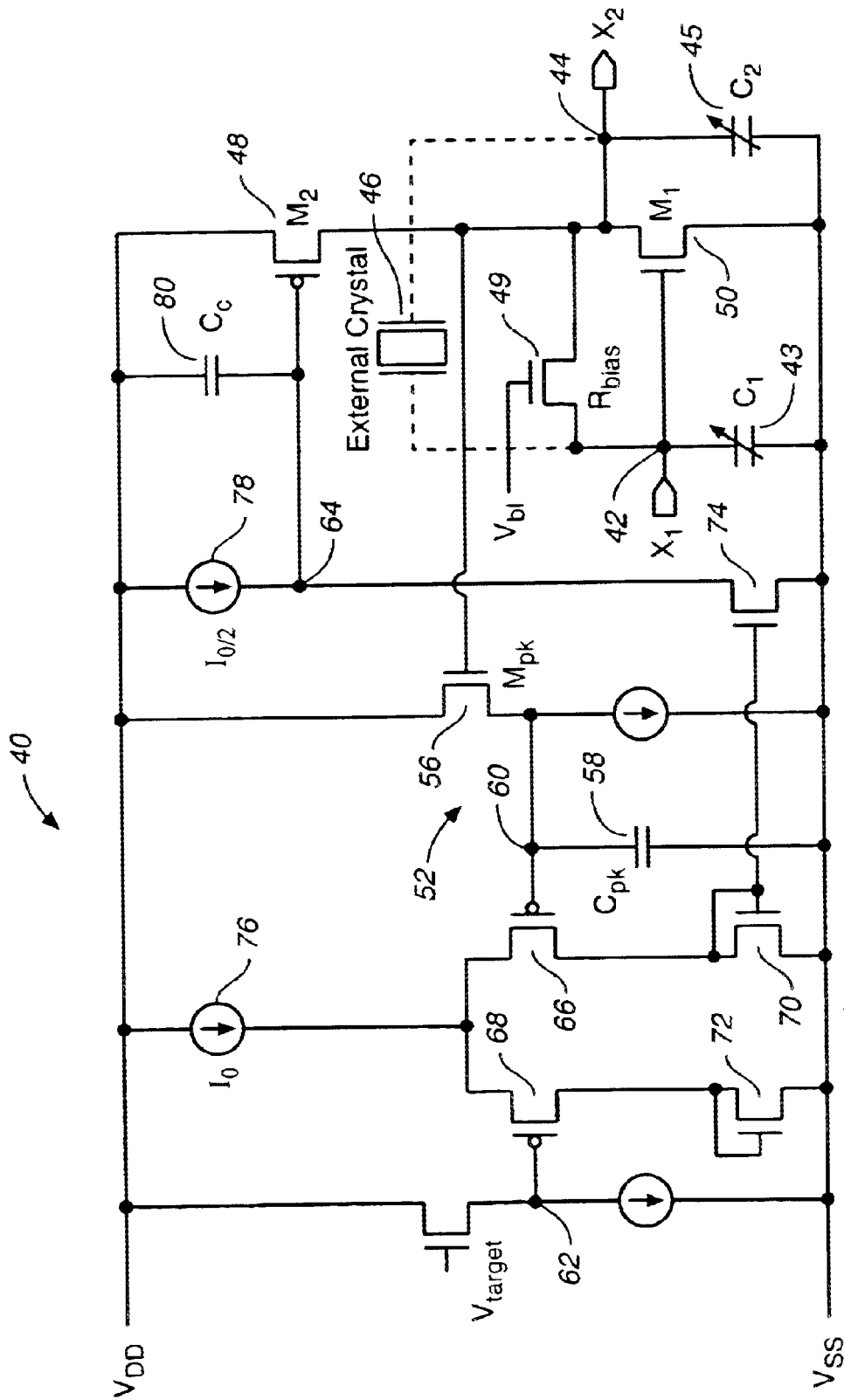
FIG._4

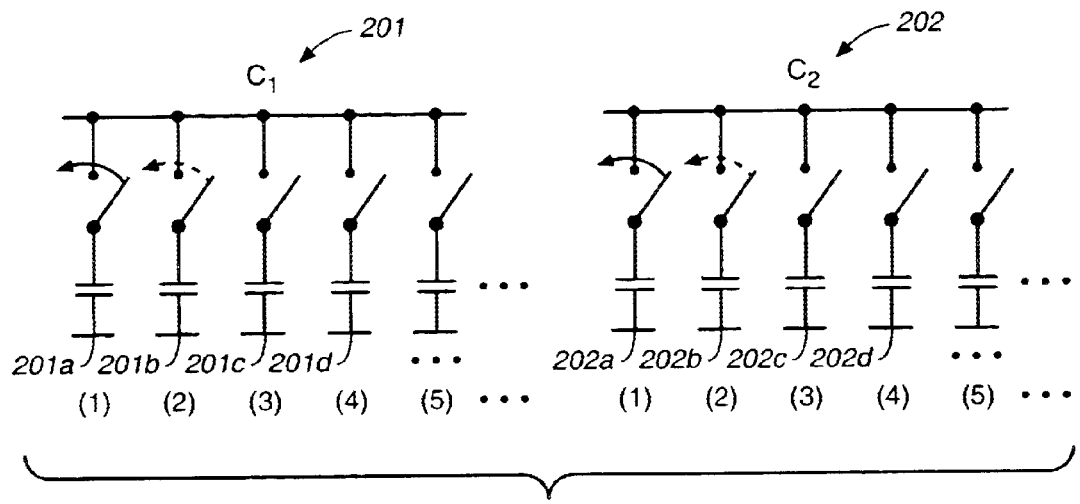
FIG._7A
*(PRIOR ART)*
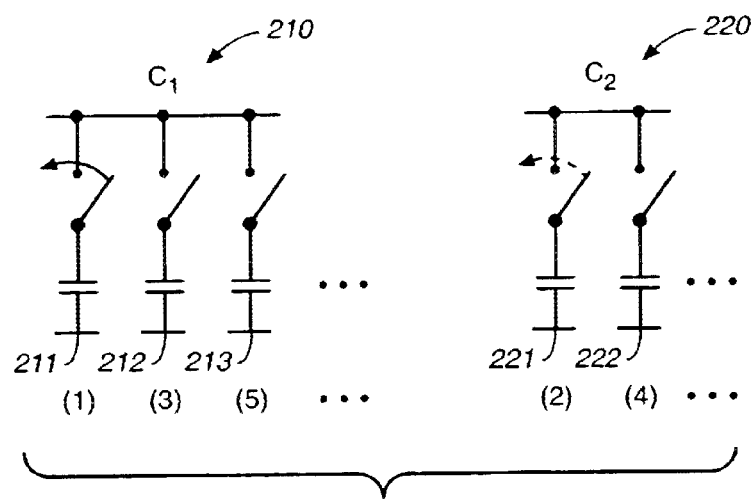
FIG._7B

METHOD AND APPARATUS FOR CONTROLLING OSCILLATION AMPLITUDE AND OSCILLATION FREQUENCY OF CRYSTAL OSCILLATOR

FIELD OF THE INVENTION

The present invention relates to crystal oscillators. More particularly, the present invention relates to oscillation amplitude control and oscillation frequency control of crystal oscillators.

BACKGROUND OF THE INVENTION

Crystal oscillators are used in many applications to provide an accurate and stable frequency reference such as a clock signal. In most cases it is also required to be able to pull the crystal around the center frequency so that the oscillator can be enclosed in a timing loop. Although the amplitude of oscillation is often not a system requirement, for a number of reasons it is still important to have a well defined amplitude of oscillation. For example, since the power dissipated in a crystal depends on the amplitude of oscillation, the oscillation amplitude cannot exceed several milliwatts in order to ensure stable crystal frequency with aging. Furthermore, in many applications, electrostatic discharge (ESD) protection devices are connected to the pads in a chip to which the crystal oscillator is coupled. Uncontrolled oscillation amplitude may cause overshoots and undershoots, and the ESD protection devices will be turned on when the voltage goes below ground voltage. This will cause clipping in the waveform and introduce jitter in the output clock signal. In addition, a stable amplitude can also lead to a more robust design of a buffer following the crystal oscillator that converts the oscillation voltage to standard COMS logic levels.

One of the best known oscillator structures is the so-called three-point oscillator. FIG. 1A schematically illustrates the basic structure of a three-point oscillator 1. Depending on which of the three points is an AC ground (nodes 2, 3, or 4), the circuit is referred to as a Pierce, Colpitts, or Clapp oscillator. As shown in FIG. 1A, the crystal oscillator 1 includes a crystal resonator 5, a transistor 6 (M1), a first capacitor 7 (C1), and a second capacitor 8 (C2). It is well known that the Pierce configuration has, among these three configurations, some of the best properties with respect to frequency stability. In FIG. 1A, the crystal resonator 5 which is coupled between the node 2 and 3 is illustrated as an equivalent circuit of $L_s$, $C_s$, and $R_s$. A capacitance $C_0$ is a crystal static capacitance referred to as the "shunt" capacitance and includes a capacitance due to the electrodes on the crystal plate and stray capacitance due to the crystal enclosure.

It is well known that transistor M1 (with a transconductance $g_m$) combined with capacitors $C_1$ and $C_2$ constitutes a frequency dependent negative resistance (–R) in series with $C_1$ and $C_2$, as shown in FIG. 1B. The negative resistance is given as:

$$-R = \frac{g_m}{\omega_0 C_1 C_2}. \quad (1)$$

When the capacitance of capacitors $C_1$ and $C_2$ are much higher than the shunt capacitance $C_0$, as are in practical designs, Equation (1) can be used to estimate the critical transconductance $g_{mc}$ of the transistor M1 as:

$$g_{mc} = R_s \omega_0^2 C_1 C_2 \quad (2).$$

The critical transconductance $g_{mc}$ is the minimum transconductance required to compensate the loss due to the motional resistance $R_s$ of the crystal resonator 5 and sustain the oscillation. For the best trade-off between frequency stability and required transconductance, the capacitors $C_1$ and $C_2$ should be equal.

FIG. 2 illustrates a basic circuit structure of a conventional Pierce oscillator 10. As shown in FIG. 2, the conventional Pierce oscillator 10 includes a crystal resonator 12, a current source 14 supplying a bias current to the crystal resonator 12, and an output transistor 16 ($M_1$) coupled to the crystal resonator 12 and the current source 14. The crystal resonator 12 may be externally coupled to the chip on which the oscillator circuitry is implemented, as the connection is indicated by a broken line. A transistor 18 coupled between the output and input nodes of the crystal resonator 12 provides a bias resistance Rbias, the gate of which is couple to a bias voltage $V_{b1}$. Capacitors 15 and 17 ($C_1$ and $C_2$) are also coupled to the crystal resonator 12. The two capacitors 15 and 17 are typically identical switched-capacitor arrays and used to tune the oscillation frequency. The tuning range and resolution depend on the tolerance of CMOS device values, stray (parasitic) capacitances of the capacitor arrays, and the maximum trimming capacitance.

As is seen from FIG. 2, when most of the noise up to the current source 14 is filtered, the primary noise contributors are the current source 14, the transistor 16, and the bias transistor 18 (neglecting the loss in the crystal and other noise injection through the voltage supply and substrate). The design task mainly consists of minimizing noise from these components whilst making sure that oscillations can be sustained at all times. The bias current required by the oscillator 10 depends on the amplitude of oscillation, the losses in the crystal, and also other process and environment parameters. Thus, a fixed bias circuit may not be able to guarantee oscillations over all conditions, nor find an optimum value to minimize power and ensure a fixed oscillation.

Accordingly, it would be desirable to provide a scheme to control an oscillation amplitude at an optimal level so as to increases the noise immunity of the crystal oscillator and at the same time to keep the amplitude small enough to avoid waveform distortion such as clipping by ESD protection devices. In addition, it would be desirable to provide a scheme of digitally tuning the oscillation frequency around a center frequency with an appropriate range and resolution required for applications.

BRIEF DESCRIPTION OF THE INVENTION

A circuit controls an oscillation amplitude of a crystal oscillator, the crystal oscillator including a crystal resonator, a current source supplying a bias current to the crystal resonator, and an output transistor coupled to the crystal resonator and the current source. The circuit includes a peak detector coupled to an output of the crystal oscillator for detecting a peak voltage of an output signal of the crystal oscillator, and a controller coupled to the peak detector and to the current source for controlling the current source in accordance with a difference between the peak voltage and a target voltage, the target voltage being set to be substantially equal to $2V_{th}$, where $V_{th}$ is a threshold voltage of the output transistor. The crystal oscillator further includes a first capacitor array coupled between the input node and a second supply voltage, and a second capacitor array coupled between the output node and the second supply voltage. The first capacitor array includes a first plurality of switched-capacitors, and the second capacitor array includes a second plurality of switched-capacitors. A frequency control circuit is coupled to the first capacitor array and the second capacitor array. The frequency control circuit includes an input for receiving a frequency control signal, and a capacitance controller for alternately switching a switched-capacitor in the first capacitor array and a switched-capacitor in the second capacitor array for successive changes in capacitance based on the frequency control signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1A is an electrical schematic diagram illustrating the basic structure of a three-point oscillator.

FIG. 1B is an electrical schematic diagram illustrating an equivalent circuit of the three-point oscillator.

FIG. 2 is an electrical schematic diagram illustrating a basic circuit structure of a conventional Pierce oscillator.

FIG. 3 is a block diagram schematically illustrating a circuit for controlling an oscillation amplitude of a crystal oscillator in accordance with an embodiment of the present invention.

FIG. 4 is an electrical schematic diagram illustrating a crystal oscillator with an oscillation amplitude control in accordance with a specific embodiment of the present invention.

FIG. 5 is an electrical schematic diagram illustrating an oscillation frequency control circuit in accordance with a specific embodiment of the present invention.

FIG. 6 is an electrical schematic diagram illustrating an example of switched-capacitors in a switched-capacitor array.

FIG. 7A is a diagram schematically illustrating conventional switched-capacitor arrays in a conventional digital frequency tuning.

FIG. 7B is a diagram schematically illustrating a digital frequency tuning using switched-capacitor arrays in accordance with a specific embodiment of the present invention.

DETAILED DESCRIPTION

Embodiments of the present invention are described herein in the context of a method and apparatus for controlling an oscillation amplitude and an oscillation frequency of a crystal oscillator. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 3 schematically illustrates a circuit 20 for controlling an oscillation amplitude of a crystal oscillator 30 in accordance with an embodiment of the present invention. A crystal oscillator 30 includes a crystal resonator circuit 32 and a current source 34 supplying a bias current to the crystal resonator circuit 32. The crystal resonator circuit 32 may be configured as a Pierce oscillator including a crystal resonator (such as an external crystal) and an output transistor $M_1$ having a threshold voltage $V_{th}$ (not shown in FIG. 3). The circuit 20 is an automatic amplitude control circuit and includes a peak detector 22 and a controller 24. The control circuit 20 senses the oscillation amplitude of the crystal oscillator 30 and adjusts it all times to be equal to a target voltage ($V_{target}$).

As shown in FIG. 3, the peak detector 22 is coupled to the output of the crystal oscillator 30 and detects a peak voltage of an output signal $V_{out}$. The controller 24 is coupled to the peak detector 22 and to the current source 34, and controls the current source 34 in accordance with a difference between the peak voltage and a target voltage $V_{target}$. In accordance with a specific embodiment of the present invention, the controller 24 includes a comparator 26. The comparator 26 compares the peak voltage with the target voltage $V_{target}$, and outputs a control signal in accordance with the comparison.

However, the target voltage $V_{target}$ is not a fixed value such as the supply voltage. The target voltage is an adjusting parameter so that the oscillation amplitude has the possible highest peak without distorting the waveform from a sinusoid. In general, since a high slew rate is desirable, the oscillation amplitude is set as high as possible to minimize phase noise degradation. However if the oscillation amplitude is set to be the supply voltage, that would cause distortion of the waveform, and thereby increase power dissipated in the crystal. Such distortion will introduce harmonics which cause jitter due to non-linear effects. The same problem can happen if the waveform is distorted due to clamping action by ESD protection devices, as described above. Thus, the target voltage is set so as to prevent undershoot of the oscillation below ground or overshoot thereof above the supply voltage. Accordingly, in accordance with an embodiment of the present invention, the target voltage $V_{target}$ is set to be substantially equal to $2 \times V_{th}$.

FIG. 4 illustrates a crystal oscillator circuit 40 with an oscillation amplitude control in accordance with a specific embodiment of the present invention. The crystal oscillator circuit 40 includes an input node 42 for receiving an input signal, an output node 44 for outputting an output signal (oscillation signal), a crystal resonator (such as an external crystal) 46 coupled between the input node 42 and the output node 44, a current source 48 coupled to a first supply voltage $V_{DD}$, an output transistor 50 ($M_1$), a peak detector circuit 52, and an amplitude control circuit 54. The gate of the transistor 50 is coupled to the input node 42, the drain of the transistor 50 is coupled to the current source 48 and to the output node 44, and the source of the transistor 50 is coupled to a second supply voltage $V_{SS}$. The transistor 50 has a threshold voltage $V_{th}$. A first switched-capacitor array 43 ($C_1$) is coupled between the input node 42 and a second supply voltage ($V_{SS}$), and a second switched-capacitor array 45 ($C_2$) is coupled between the output node 44 and the second supply voltage ($V_{SS}$). The second supply voltage $V_{SS}$ may be the ground voltage.

The current source 48 supplies a bias current to the crystal resonator 46. The current source 48 may include a current-setting PMOS transistor $M_2$ the source of which is couple to the first supply voltage $V_{DD}$. The drain of the transistor $M_2$ is coupled to the drain of the transistor 50 ($M_1$). A transistor 49 coupled between the input node 42 and the output node 44 provides a bias resistance Rbias, which has a gate couple to a bias voltage $V_{b1}$. The peak detector circuit 52 is coupled to the output node 44, and detects the maximum voltage of the output signal at the output node 44. The amplitude control circuit 54 is coupled to the peak detector circuit 52 and the current source 48, and controls the current source 48 based on the maximum voltage and the target voltage $V_{target}$. As described above, the target voltage is set to be substantially equal to $2 \times V_{th}$, where $V_{th}$ is the threshold voltage of the transistor 50.

As shown in FIG. 4, the peak detector 52 includes a transistor 56 ($M_{pk}$) and a capacitor 58 ($C_{pk}$) which detect the maximum voltage on the drain of the transistor 50 ($M_1$) coupled to the output node 44. The maximum voltage is then compared with the target voltage ($V_{target}$) by the amplitude control circuit 54 so as to determine the gate bias voltage of the PMOS transistor $M_2$ (i.e., the current source 48). The amplitude control circuit 54 includes a comparator (operational amplifier) having two inputs 60 and 62 for receiving the maximum voltage and the target voltage, respectively, and an output 64 coupled to the gate of the source current transistor 48 ($M_2$). That is, two PMOS transistors 66 and 68, two NMOS transistors 70 and 72, an output NMOS transistor 74, a first current source 76, and a second current source 78 form the comparator of the amplitude control circuit 54.

When the oscillation amplitude is small, i.e., the detected maximum voltage is lower than the target voltage $V_{target}$, the control signal from the output 64 controls the current source transistor 48 ($M_2$) so that more current is provided to increase the oscillation amplitude. If the detected maximum voltage is higher than the target voltage $V_{target}$, the control signal from the output 64 controls the current source transistor 48 ($M_2$) so that less current is provided to decrease the oscillation amplitude. As shown in FIG. 4, the loop may be stabilized by a small capacitor 80 ($C_c$). The capacitor 80 also serves to filter noise, for example, above the 3 dB corner of the loop bandwidth. The noise contribution of the current source 48 ($M_2$) may be reduced by designing with a large saturation voltage $V_{dsat}$ and also by making sure that the 1/f corner is low.

Under normal conditions the transistor 50 ($M_1$) in combination with the first and second capacitors 42 ($C_1$) and 45 ($C_2$) acts as a negative resistance to cancel the loss in the crystal resonator 46, as described above. To provide a sufficient negative resistance over all process/temperature/crystal loss variations the W/L ratio of the transistor 50 ($M_1$) is typically quite large (>~1000). Thus, the average voltage ($V_{ave}$) of the output oscillation signal is very close to the threshold voltage $V_{th}$ of the output device $M_1$. In actuality because of the nonlinear switching of the transistor $M_1$, the average voltage $V_{ave}$ is slightly lower than the threshold voltage $V_{th}$ of the device. The voltage at the gate of the transistor $M_1$ is very close to a sinusoid riding on the average voltage $V_{ave}$. The optimum amplitude to avoid undershoot is then equal to the average voltage $V_{ave}$ itself.

If it is assumed that the average voltage $V_{ave}$ is exactly the same as the threshold voltage $V_{th}$ of the transistor 50 ($M_1$), the target peak voltage should be $2 \times V_{th}$. The target voltage $V_{target}$ may be generated by a $V_{th}$ extractor from a replica transistor matched to the transistor 50 ($M_1$) and then doubling the extracted voltage. The actual average voltage ($V_{target}'$) used in an actual implementation is somewhat less than the ideal target voltage $V_{target}$ described above so as to account for offsets and non-linear effects of the transistor 50 ($M_1$).

The amplitude control circuit 54 along with the bias resistance $R_{bias}$ (bias transistor 49) also serves to ensure startup during the power-up or other initializing process of the crystal oscillator 40. Upon the power-up the bias current may be very small with no oscillation. Thus, the amplitude control circuit 54 tries to increase the bias current from the current source transistor 50 ($M_1$), and thus drives the output transistor 50 ($M_1$) (with Rbias connection) in its high gain region. This will then help amplify the input noise (input small signal) and thereby build oscillation. Upon reaching the optimum oscillation amplitude, the bias current is reduced to an amount so as to sustain the oscillation. That is, the bias current is sufficient for oscillation but not contribute unnecessary thermal noise which can cause phase noise. The bias resistance Rbias is internal to the chip and is of the order of 200 kΩ in accordance with a specific embodiment of the present invention.

In accordance with a specific embodiment of the present invention, a digital tuning technique suitable for monolithic integration of the oscillator is also employed. The required tuning is achieved by digitally switching switchable-capacitors in and out of the capacitor arrays $C_1$ and $C_2$. FIG. 5 schematically illustrates an oscillation frequency control circuit 90 in accordance with a specific embodiment of the present invention. The frequency control circuit 90 may be used along with the oscillation amplitude control as described above, or may be used independently.

In FIG. 5, a crystal resonator 100 is illustrated with its equivalent circuit of $L_m$, $C_m$, $R_m$, and a static capacitance $C_0$, in the similar manner as described above (FIG. 1A). The crystal resonator 100 is coupled between an input node 102 and an output node 104. As shown in FIG. 5, the frequency control circuit 90 includes a first capacitor array 92 ($C_1$) and a second capacitor array 94 ($C_2$). The first capacitor array 92 is coupled between the input node 102 and a reference second supply voltage, such as $V_{SS}$ or the ground voltage, and includes a first plurality of switched-capacitors. Similarly, the second capacitor array 94 is coupled between the output node 104 and the reference voltage, and includes a second plurality of switched-capacitors.

As shown in FIG. 5, the frequency control scheme 90 further includes a capacitance controller 96 coupled to the first capacitor array 92 and the second capacitor array 94. The capacitance controller 96 receives a frequency control signal and alternately switches a switched-capacitor in the first capacitor array 92 and a switched-capacitor in the second capacitor array 94 for successive changes in capacitance based on the frequency control signal.

FIG. 6 schematically illustrates an example of switched-capacitors 106 in the capacitor arrays. Each switched-capacitor includes a unit capacitor 107 and a switching device 108, typically a metal oxide semiconductor field effect transistor (MOSFET). The switching devices 108 are controlled by the frequency control signal, typically a digital voltage signal, or digital code. According to the digital code, the corresponding number of the unit capacitors are switched in the capacitor array so as to change the amount of the capacitance coupled to the crystal resonator. Thus, the unit capacitance determines the minimum changeable capacitance, i.e., the minimum tuning step, and thus determines the resolution of the frequency tuning. However, in a CMOS process parasitic capacitances (indicated by 109 in FIG. 6) due to back-plate parasitics, metal routing parasitics, and other fringe effects are unavoidable. The ratio of parasitic capacitance to the switchable capacitance of the capacitor is an important parameter, since it ultimately decides the frequency resolution, as mentioned above, and the total tuning range.

The tuning step size can be determined as follows. As described above, the oscillation characteristic of a crystal resonator is defined by values of $L_m$, $C_m$, $R_m$ and $C_0$, which are given when the crystal resonator is manufactured. The oscillation frequency of the crystal oscillator is approximately given by:

$$F_{osc} = \frac{1}{2\pi\sqrt{L_m C_m \left(\frac{C_1}{C_1 + C_m}\right)}} \text{ and} \quad (3)$$

$$F_{osc} \approx \frac{1}{2\pi\sqrt{L_m C_m}}\left(1 + \frac{C_m}{2C_1}\right), \text{ where } C_m << C_1 \quad (4)$$

It is clear from Equation (4) that to achieve a digital tuning with a sub-ppm step size, the unit capacitance switched in/out of the capacitor array has to be of the order of $C_m$, which is typically 10–100 fF. Thus, in a case where the crystal resonator has $C_m$ about 20 fF, in order to obtain a sub-ppm resolution, the capacitance of the unit capacitor is of the order of 10–20 fF. However, as described above, in a CMOS process there are a lot of parasitic capacitances and other fringe effects that are unavoidable. Thus, it is important to reduce the ratio of parasitic capacitance to the switchable capacitance in order to achieve a good frequency resolution and a wide tuning range.

FIG. 7A schematically illustrates the first capacitor array 201 ($C_1$) and the second capacitor array 202 ($C_2$) used for a frequency tuning in prior art. As mentioned above, the conventional first and second capacitor arrays are identical (i.e., $C_1=C_2$), and include the same number of the identical unit capacitors. As shown in FIG. 7A, the first conventional switched-capacitor array 201 includes unit capacitors 201a, 202b, 202c, etc., and the second conventional capacitor array 202 includes unit capacitors 202a, 202b, 202c, etc. For example, each switched-capacitor array is typically partitioned into 32 segments of thermometer-coded unit capacitors. Each segment has 8 poly-insulator-poly (PIP) unit-capacitors of the same value. A 9-bit control word selects which unit capacitor is switched in/out of the capacitor array.

In the conventional frequency tuning, as shown in FIG. 7A, a corresponding pair of unit capacitors from the first capacitor array 201 and the second capacitor array 202 are switched in/out together. For example, the unit capacitors 201a and 202a are switched in at a same tuning step by one digital code, and the unit capacitors 201b and 202b are switched in at the next tuning step by the successive digital code for increase the capacitance.

FIG. 7B schematically illustrates a digital frequency tuning using a first capacitor array 210 ($C_1$) and a second capacitor array 220 ($C_2$) in accordance with a specific embodiment of the present invention. As shown in FIG. 7B, the first capacitor array 210 includes a first plurality of unit capacitors 211, 212, 213, etc., and the second capacitor array 220 includes a second plurality of unit capacitors 221, 221, etc. In prior art the capacitor arrays $C_1$ and $C_2$ are identical, as describe above, and each code switches an identical unit capacitors into each capacitor array. However, in accordance with a specific embodiment of the present invention, unit capacitors are alternately switched into the array for every successive code of the frequency control signal. For example, as shown in FIG. 7B, a first code switches-in the unit capacitor 211 in the first capacitor array 210, and the next code switches-in the unit capacitor 221 in the second capacitor array 220, and so on.

By alternately switching the unit capacitors, the value of each unit capacitor can be doubled, but the total number of the unit capacitors is halved. For example, suppose the first capacitor array 210 and the corresponding conventional capacitor array 201 have substantially the same total (maximum switchable) capacitance ($C_1$), each unit capacitor of the first capacitor array 210 may have a capacitance about twice as large as that of a unit capacitor in the conventional capacitor array 201, and the total number of the unit capacitors of the first capacitor array 210 is about a half of that of unit capacitors in the conventional capacitor arrays 201. Similarly, when the second capacitor array 220 and the corresponding conventional capacitor array 202 have substantially the same total capacitance ($C_2$), each unit capacitor of the second capacitor array 220 may have a capacitance about twice as large as that of a unit capacitor in the conventional capacitor array 202, and the total number of the unit capacitors of the second capacitor array 220 is about a half of that of unit capacitors in the conventional capacitor arrays 202. It should be noted, however, the number of the unit capacitors and the total (or maximum) capacitance are not necessarily the same in the first capacitor array 210 and in the second capacitor arrays 220, and may differ by one in number and one unit capacitance due to the alternate switching.

This new configuration of the capacitor arrays is possible because the two capacitor arrays $C_1$ and $C_2$ are effectively connected in series, as described above. Thus, switching two unit capacitors of a equal value onto the capacitor arrays $C_1$ and $C_2$ is equivalent to switching one capacitor having a doubled capacitance value onto any one of the capacitor arrays $C_1$ or $C_2$. At any given code, the capacitor arrays $C_1$ and $C_2$ differ only by one unit capacitor value, and still have substantially the same capacitance so as to satisfy frequency stability and required transconductance. For example, the equivalent step-size is accomplished by changing the unit capacitor values such that for every least significant bit (LSB) change in digital code of the control signal the frequency changes by the same amount as a conventional design.

Since doubling the unit capacitors does not double the parasitics due to the fringe, this new configuration allows better frequency resolution and increased tuning range. In addition, the "gain" from the same digital code of the control signal remains constant. That is, the incremental change in output frequency remains the same for given increment in the control signal. This feature is important since the purpose of pulling the crystal oscillator is to place the oscillator in a timing recovery circuit. Providing the same gain from the same control signal makes the stability of the timing recovery loop easier to design.

The above-described tuning scheme to switch-in capacitors to pull the crystal frequency around the nominal center frequency may be referred to as a "ping-pong" technique. This technique helps to increase tuning range within a given technology without increasing complexity. In accordance with a specific embodiment of the present invention, the crystal oscillator has a tuning range of at least 200 ppm with better than a 0.5 ppm resolution around the center frequency of 32.000 MHz, and a phase noise better than −97 dBc/Hz at a frequency offset of 300 Hz from the carrier. A fundamental crystal may be chosen to achieve the pulling requirement. However, these specific values are mere examples, and may be changed depending on applications and required specification.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A circuit for controlling an oscillation amplitude of a crystal oscillator, the crystal oscillator including a crystal resonator, a current source supplying a bias current to said crystal resonator, and an output transistor coupled to said crystal resonator and said current source, said circuit comprising:
    a peak detector coupled to an output of the crystal oscillator, detecting a peak voltage of an output signal of the crystal oscillator; and
    a controller coupled to said peak detector and to the current source controlling said current source in accordance with a difference between the peak voltage and a target voltage, the target voltage being set to be substantially equal to $2V_{th}$, where $V_{th}$ is a threshold voltage of the output transistor.

2. A circuit according to claim 1, wherein an average voltage of the output signal is substantially equal to the threshold voltage of the output transistor.

3. A circuit according to claim 1, wherein said controller includes:
    a comparator comparing the peak voltage with the target voltage, and for outputting a control signal in accordance with the comparison; and
    a current controller coupled to said comparator controlling a bias current supplied from the current source based on the control signal.

4. A crystal oscillator comprising:
    an input node for receiving an input signal;
    an output node for outputting an output signal;
    a crystal resonator coupled between said input node and said output node;
    a current source coupled to a first supply voltage, for supplying a bias current to said crystal resonator;
    a transistor, a gate of said transistor being coupled to said input node, a drain of said transistor being coupled to said current source and said output node, a source of said transistor being coupled to a second supply voltage;
    a peak detector circuit coupled to said output node, for detecting a maximum voltage of the output signal at said output node; and
    an amplitude control circuit coupled to said peak detector circuit and said current source, for controlling said current source based on the maximum voltage and a target voltage, the target voltage being set to be substantially equal to $2V_{th}$, where $V_{th}$ is a threshold voltage of said transistor.

5. A crystal oscillator according to claim 4, wherein an average voltage of the output signal is substantially equal to the threshold voltage of said transistor.

6. A crystal oscillator according to claim 4, wherein said amplitude control circuit includes a comparator coupled to said peak detector and a reference voltage supplying the target voltage, for comparing the maximum voltage with the target voltage and outputting a control signal in accordance with a difference between the maximum voltage and the target voltage.

7. A crystal oscillator according to claim 6, wherein said current source includes a current source transistor coupled to the first supply voltage, a gate of said current source transistor being controlled by the control signal.

8. A crystal oscillator according to claim 4, further comprising:
    a first capacitor array coupled between said input node and the second supply voltage, said first capacitor array including a first plurality of switched-capacitors and having a first total capacitance; and
    a second capacitor array coupled between said output node and the second supply voltage, said second capacitor array including a second plurality of switched-capacitors and having a second total capacitance.

9. A crystal oscillator according to claim 8, further comprising a frequency control circuit coupled to said first capacitor array and said second capacitor array, said frequency control circuit including:
    an input for receiving a frequency control signal; and
    a capacitance controller for alternately switching a switched-capacitor in said first capacitor array and a switched-capacitor in said second capacitor array for successive changes in capacitance based on said frequency control signal.

10. A crystal oscillator according to claim 9, wherein each of said switched-capacitors of said first capacitor array has a capacitance about twice as large as that of a unit capacitor of a conventional capacitor array having a total capacitance substantially same as the first total capacitance.

11. A crystal oscillator according to claim 10, wherein a total number of the switched-capacitors of said first capacitor array is about a half of a total number of unit capacitors of a conventional capacitor array having a total capacitance substantially same as the first total capacitance.

12. A crystal oscillator according to claim 9, wherein each of said switched-capacitors of said second capacitor array has a capacitance about twice as large as that of a unit capacitor of a conventional capacitor array having a total capacitance substantially same as the second total capacitance.

13. A crystal oscillator according to claim 12, wherein a total number of said switched-capacitors of said second capacitor array is about a half of a total number of unit capacitors of a conventional capacitor array having a total capacitance substantially same as the second total capacitance.

14. A method for controlling a crystal oscillator, the crystal oscillator including a crystal resonator, a current source supplying a bias current to said crystal resonator, and an output transistor coupled to the crystal resonator and the current source, said method comprising:
    setting a target voltage substantially equal to $2V_{th}$, where $V_{th}$ is a threshold voltage of the output transistor;
    detecting a peak voltage of an output signal of the crystal oscillator;
    comparing the peak voltage with the target voltage; and
    controlling the current source in accordance with a difference between the peak voltage and a target voltage, thereby controlling an amplitude of the output signal.

15. A method according to claim 14, wherein an average voltage of said output signal is substantially equal to the threshold voltage of said output transistor.

16. A method according to claim 14, wherein said current source includes a current source transistor coupled to a supply voltage, and said controlling includes:
  generating a control signal in accordance with said comparing; and
  controlling a gate bias voltage of the supply current transistor based on the control signal.

17. A method according to claim 14, wherein said crystal oscillator is coupled between an input node and an output node, said method further comprising:
  providing a first capacitor array between the input node and a second supply voltage, the first capacitor array including a first plurality of switched-capacitors;
  providing a second capacitor array between the output node and the second supply voltage, the second capacitor array including a second plurality of switched-capacitors;
  receiving a frequency control signal; and
  alternately switching a switched-capacitor in the first capacitor array and a switched-capacitor in the second capacitor array based on the frequency control signal.

18. An apparatus for controlling a crystal oscillator, the crystal oscillator including a crystal resonator, a current source supplying a bias current to the crystal resonator, and an output transistor coupled to the crystal resonator and the current source, said apparatus comprising:
  means for setting a target voltage substantially equal to $2V_{th}$, where $V_{th}$ is a threshold voltage of the output transistor;
  means for detecting a peak voltage of an output signal of the crystal oscillator; and
  means for controlling the current source in accordance with a difference between the peak voltage and a target voltage, thereby controlling an amplitude of the output signal.

19. An apparatus according to claim 18, wherein an average voltage of said output signal is substantially equal to the threshold voltage of said output transistor.

20. An apparatus according to claim 18, wherein said means for controlling includes:
  means for comparing the peak voltage with the target voltage;
  means for generating a control signal in accordance with said comparison; and
  means for controlling a supply current from the current source based on the control signal.

21. An apparatus according to claim 18, wherein said crystal oscillator is coupled between an input node and an output node, said apparatus further comprising:
  first means for providing a first plurality of switched-capacitors between the input node and a reference voltage;
  second means for providing a second plurality of switched-capacitors between the output node and the reference voltage;
  means for receiving a frequency control signal; and
  means for alternately switching a switched-capacitor in said first means and a switched-capacitor in said second means based on the frequency control signal.

22. A circuit for controlling a frequency of a crystal oscillator, the crystal oscillator being coupled between an input node and an output node, said circuit comprising:
  a first capacitor array coupled between the input node and a reference voltage, said first capacitor array including a first plurality of switched-capacitors and having a first total capacitance;
  a second capacitor array coupled between the output node and the reference voltage, said second capacitor array including a second plurality of switched-capacitors and having a second total capacitance;
  an input for receiving a frequency control signal; and
  a capacitance controller coupled to said first capacitor array and said second capacitor array, said capacitance controller switching a switched-capacitor in said first capacitor array and a switched-capacitor in said second capacitor array alternately to each other based on the frequency control signal such that the switched-capacitor in said first capacitor array and the switched-capacitor in said second capacitor array are not switched at the same time,
  wherein each of said switched-capacitors of said first capacitor array has a capacitance about twice as large as that of a unit capacitor of a conventional capacitor array having a total capacitance substantially same as the first total capacitance.

23. A circuit according to claim 22, wherein a total number of said switched-capacitors of said first capacitor array is about a half of a total number of unit capacitors of a conventional capacitor array having a total capacitance substantially same as the first total capacitance.

24. A circuit for controlling a frequency of a crystal oscillator, the crystal oscillator being coupled between an input node and an output node, said circuit comprising:
  a first capacitor array coupled between the input node and a reference voltage, said first capacitor array including a first plurality of switched-capacitors and having a first total capacitance;
  a second capacitor array coupled between the output node and the reference voltage, said second capacitor array including a second plurality of switched-capacitors and having a second total capacitance;
  an input for receiving a frequency control signal; and
  a capacitance controller coupled to said first capacitor array and said second capacitor array, said capacitance controller switching a switched-capacitor in said first capacitor array and a switched-capacitor in said second capacitor array alternately to each other based on the frequency control signal such that the switched-capacitor in said first capacitor array and the switched-capacitor in said second capacitor array are not switched at the same time,
  wherein each of said switched-capacitors of said second capacitor array has a capacitance about twice as large as that of a unit capacitor of a conventional capacitor array having a total capacitance substantially same as the second total capacitance.

25. A circuit according to claim 24, wherein a total number of said switched-capacitors of said second capacitor array is about a half of a total number of unit capacitors of a conventional capacitor array having a total capacitance substantially same as the second total capacitance.

26. A method for controlling an oscillation frequency of a crystal oscillator, said crystal oscillator being coupled between an input node and an output node, said method comprising:
  providing a first capacitor array having a first total capacitance, coupled between the input node and a reference voltage, the first capacitor array including a first plurality of switched-capacitors;

providing a second capacitor array having a second total capacitance, coupled between the output node and a reference voltage, the second capacitor array including a second plurality of switched-capacitors;

receiving a frequency control signal; and switching a switched-capacitor in the first capacitor array and a switched-capacitor in the second capacitor array alternately to each other based on the frequency control signal such that the switched-capacitor in said first capacitor array and the switched-capacitor in said second capacitor array are not switched at the same time, wherein each of said switched-capacitors of said first capacitor array has a capacitance about twice as large as that of a unit capacitor of a conventional capacitor array having a total capacitance substantially same as the first total capacitance.

27. A method according to claim 26, wherein a total number of said switched-capacitors of said first capacitor array is about a half of a total number of unit capacitors of a conventional capacitor array having a total capacitance substantially same as the first total capacitance.

28. A method for controlling an oscillation frequency of a crystal oscillator, said crystal oscillator being coupled between an input node and an output node, said method comprising:

providing a first capacitor array having a first total capacitance, coupled between the input node and a reference voltage, the first capacitor array including a first plurality of switched-capacitors;

providing a second capacitor array having a second total capacitance, coupled between the output node and a reference voltage, the second capacitor array including a second plurality of switched-capacitors;

receiving a frequency control signal; and switching a switched-capacitor in the first capacitor array and a switched-capacitor in the second capacitor array alternately to each other based on the frequency control signal such that the switched-capacitor in said first capacitor array and the switched-capacitor in said second capacitor array are not switched at the same time, wherein each of said switched-capacitors of said second capacitor array has a capacitance about twice as large as that of a unit capacitor of a conventional capacitor array having a total capacitance substantially same as the second total capacitance.

29. A method according to claim 28, wherein a total number of said switched-capacitors of said second capacitor array is about a half of a total number of unit capacitors of a conventional capacitor array having a total capacitance substantially same as the second total capacitance.

30. An apparatus for improving a frequency resolution in tuning an oscillation frequency of a crystal oscillator coupled between an input node and an output node, said method comprising:

first means for providing a first plurality of switched-capacitors between the input node and a reference voltage;

second means for providing a second plurality of switched-capacitors between the output node and a reference voltage;

means for receiving a frequency control signal; and means for switching a switched-capacitor in said first means and a switched-capacitor in said second means alternately to each other based on the frequency control signal such that the switched-capacitor in said first capacitor array and the switched-capacitor in said second capacitor array are not switched at the same time, wherein said first means includes means for increasing a capacitance of each of the switched-capacitors therein to a capacitance about twice as large as that of a unit capacitor of a conventional capacitor array having a total capacitance substantially same as the first total capacitance.

31. An apparatus according to claim 30, wherein said first means further includes means for reducing a total number of the switched-capacitors therein to about a half of a total number of unit capacitors in a conventional capacitor array having a total capacitance substantially same as the first total capacitance.

32. An apparatus for improving a frequency resolution in tuning an oscillation frequency of a crystal oscillator coupled between an input node and an output node, said method comprising:

first means for providing a first plurality of switched-capacitors between the input node and a reference voltage;

second means for providing a second plurality of switched-capacitors between the output node and a reference voltage;

means for receiving a frequency control signal; and means for switching a switched-capacitor in said first means and a switched-capacitor in said second means alternately to each other based on the frequency control signal such that the switched-capacitor in said first capacitor array and the switched-capacitor in said second capacitor array are not switched at the same time, wherein said second means includes means for increasing a capacitance of each of the switched-capacitors therein to a capacitance about twice as large as that of a unit capacitor of a conventional capacitor array having a total capacitance substantially same as the second total capacitance.

33. An apparatus according to claim 32, wherein said second means further includes means for reducing a total number of the switched-capacitors therein to about a half of a total number of unit capacitors in a conventional capacitor array having a total capacitance substantially same as the second total capacitance.

* * * * *